United States Patent [19]
Nguyen et al.

[11] Patent Number: 5,606,185
[45] Date of Patent: Feb. 25, 1997

[54] PARABOLICALLY GRADED BASE-COLLECTOR DOUBLE HETEROJUNCTION BIPOLAR TRANSISTOR

[75] Inventors: Chanh Nguyen; Takyiu Liu, both of Newbury Park, Calif.

[73] Assignee: Hughes Aircraft Company, Los Angeles, Calif.

[21] Appl. No.: 349,096

[22] Filed: Dec. 1, 1994

[51] Int. Cl.⁶ .................. H01L 31/0328; H01L 31/0336; H01L 31/072
[52] U.S. Cl. .......................... 257/197; 257/198; 257/191
[58] Field of Search .................................. 257/197, 198, 257/191

[56] References Cited

U.S. PATENT DOCUMENTS 5,170,407 12/1992 Schubert et al. ..................... 372/96

OTHER PUBLICATIONS

C. G. Van de Walle, "Band lineups and deformation potentials in the model–solid theory", Physical Review, vol. B39, pp. 1871–1881 (15 Jan. 1989).

*Primary Examiner*—Wael Fahmy
*Attorney, Agent, or Firm*—V. D. Duraiswamy; W. K. Denson-Low

[57] ABSTRACT

A double heterojunction bipolar transistor (DHBT) is provided with a parabolic grade in bandgap at the base-collector junction. The parabolic grade in bandgap is close to parabolic in composition. The parabolic grade in bandgap is achieved by employing a chirped superlattice to mimic the parabolically varying alloy composition. Each period of the superlattice consists of one low-bandgap layer and one high-bandgap layer. The average composition in each period is determined by the relative thicknesses of these two layers. By varying the thickness ratio of these two layers approximately parabolically with (i) the distance from the base for a concave parabola and (ii) the distance from the collector for a convex parabola, the intended parabolic grade is achieved. The exact values may be computed numerically.

19 Claims, 5 Drawing Sheets

PARABOLICALLY GRADED BASE-COLLECTOR DOUBLE HETEROJUNCTION BIPOLAR TRANSISTOR

CROSS-REFERENCE TO RELATED APPLICATION

The present application is related to U.S. patent application Ser. No. 08/349,097 filed on even date herewith. That application is directed to the provision of an effective constant doping of the base-collector, whether the variation in composition from the base to the collector is linear or parabolic or other profile, in a double heterojunction bipolar transistor. The present application is directed to the use of parabolic grading in bandgap and a constant doping profile between the base and the collector.

BACKGROUND OF THE INVENTION

1. Field of the Invention

The present invention relates generally to III–V semiconductor devices, and, more particularly, to a unique bandgap profile employed in a graded superlattice.

2. Description of Related Art

It is desired to improve the output characteristics of a double heterojunction bipolar transistor (DHBT), which are attributed to problems related to the conduction band discontinuity in the base-collector (BC) junction. Improvement by conventional means has been done by one of the following approaches:

(1) Lowering the conduction band spike to below that of the conduction band minimum in the base, e.g., GaInAs, by incorporating various relatively heavily doped spacers between the base and the collector. However, this approach has the disadvantages of lower breakdown voltage and higher BC junction capacitance; and (2) Grading the BC (GaInAs-InP) junction linearly through the quaternary alloy $Ga_xIn_{1-x}P_yAs_{1-y}$. However, this approach has the disadvantage that while the electrons see a smaller potential barrier in the BC junction, features, such as barriers, in the conduction band cannot be eliminated completely. A linear grade by itself is never optimal and conduction band features remain.

The use of an InP collector in an AlInAs/GaInAs/InP DHBT significantly improves the output characteristics over that of a single heterojunction bipolar transistor (SHBT) with a GaInAs collector, primarily, a higher breakdown voltage between the open-circuited collector and emitter, ($BV_{ceo}$). However, the existence of a conduction band discontinuity (conduction band minimum of InP minus conduction band minimum of GaInAs) of ~0.25 eV has been attributed to causing a higher turn-on voltage ($V_{ce,sat}$) and "kinks" in the output ($I_c$ vs. $V_{ce}$) characteristics, among other undesirable problems.

Thus, a need remains for providing a DHBT device design which results in a completely featureless conduction band edge, free of the undesirable barriers found in the prior art DHBT devices.

SUMMARY OF THE INVENTION

In accordance with the invention, a double heterojunction bipolar transistor (DHBT) is provided with a parabolic grade in bandgap at the base-collector junction. The parabolic grade in bandgap is close to parabolic in composition. To achieve the parabolic grade, a chirped superlattice is used to mimic the parabolically varying alloy composition. Each period of the superlattice consists of one low-bandgap layer and one high-bandgap layer. The average composition in each period is determined by the relative thicknesses of these two layers. By varying the thickness ratio of these two layers approximately parabolically with (i) the distance from the base for a concave parabola and (ii) the distance from the collector for a convex parabola, the intended parabolic grade is achieved. The exact values have to be computed numerically, but this is not considered to constitute undue effort.

The present invention is a novel DHBT design which results in a completely featureless conduction band edge, free of the undesirable electron barriers found in all other existing DHBT designs. This is achieved by a combination of a parabolically-graded bandgap (composition-al) profile together with the proper doping profile between the base and the collector of the DHBT. The proper doping profile is achieved by providing effective constant doping levels, determined from the curvature of the parabolic grade, of donors and acceptors between the base and collector, as described in the above-mentioned U.S. patent application Ser. No. 08/349,097.

With an optimized parabolic base-collector (BC) grading, a DHBT has been fabricated, having a much lower $V_{ce,sat}$ and $I_c$ vs. $V_{cc}$ common emitter characteristics with much less kink during the turn-on. This approach does not require the use of any highly-doped spacers, which therefore allows a higher breakdown voltage and a lower BC junction capacitance for high speed operations. Improvement of the output characteristics of a DHBT has a significant impact on increasing the output power and the power-added efficiency for power DHBT, as well as permitting very high speed analog-to-digital (A/D) circuits.

This concept has been applied to design and fabricate an n-p-n AlInAs/GaInAs/InP DHBT with parabolic grading between the GaInAs base and the InP collector. The quaternary grade was calculated numerically and simulated by a chirped superlattice of InP/InGaAs using gas-source molecular beam epitaxy (GSMBE).

BRIEF DESCRIPTION OF THE DRAWINGS

FIG. 3a, on coordinates of energy E (in eV) and distance L (in nm), is a schematic plot of FIG. 2a;

DESCRIPTION OF THE PREFERRED EMBODIMENTS

Figure 1:
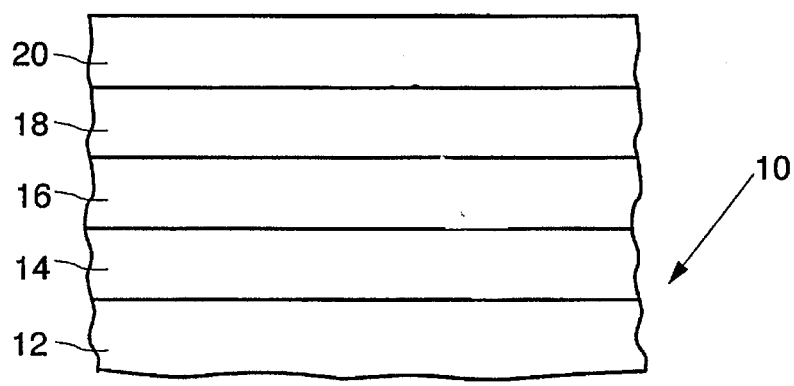
FIG. 1 is a cross-sectional view, depicting the essential features of a prior art double heterojunction bipolar transistor.

The discussion which follows is directed to an InP-based double heterojunction bipolar transistor using AlInAs or InP as the emitter, GaInAs as the base and InP as the emitter. However, it will be readily appreciated by those skilled in this art that exactly the same approach can be used for any DHBT, for example, with GaAs-based DHBT using GaInP or AlGaAs emitter, GaAs base and GaInP collector. FIG. 1 depicts an example of a DHBT 10.

As shown in FIG. 1, the double heterojunction bipolar transistor 10 comprises a substrate 12, on which is formed in sequence the following layers: a wide band gap collector layer 14, a spacer or graded base-collector region 16, a base layer 18, and a wide gap emitter layer 20. In the case of an InP-based DHBT, the substrate 12 comprises semi-insulating InP, the wide gap collector layer 14 comprises n-doped InP, the base layer 18 comprises p-doped GaInAs, and the wide gap emitter layer 20 comprises n-doped AlInAs. The graded BC region 16 comprises a graded superlattice, or a series of graded layers, ranging from pure n-doped InP to pure p-doped GaInAs. The structure of the DHBT 10 is well-known in the prior art.

To eliminate any features in the conduction band between the base 18 (GaInAs) and the collector 14 (InP), it is first important to know the variation of the conduction band minimum as a function of the composition of the alloy $Ga_xIn_{1-x}P_yAs_{1-y}$. The values of x and y are not independent, since the requirement for lattice-matching to InP dictates that $y=y(x)$; i.e., y is a function of itself. In fact, from Vegard's law, $0.468(1-y) = x$. The variation is calculated by adapting the self-consistent ab initio band structure methodology of Van de Walle's model solid approach, as is well-known; see, e.g., C. G. Van de Walle, "Band lineups and deformation potentials in the model-solid theory", Physical Review, Vol. B39, pages 1871–1881 (Jan. 15, 1989).

Figure 2A:
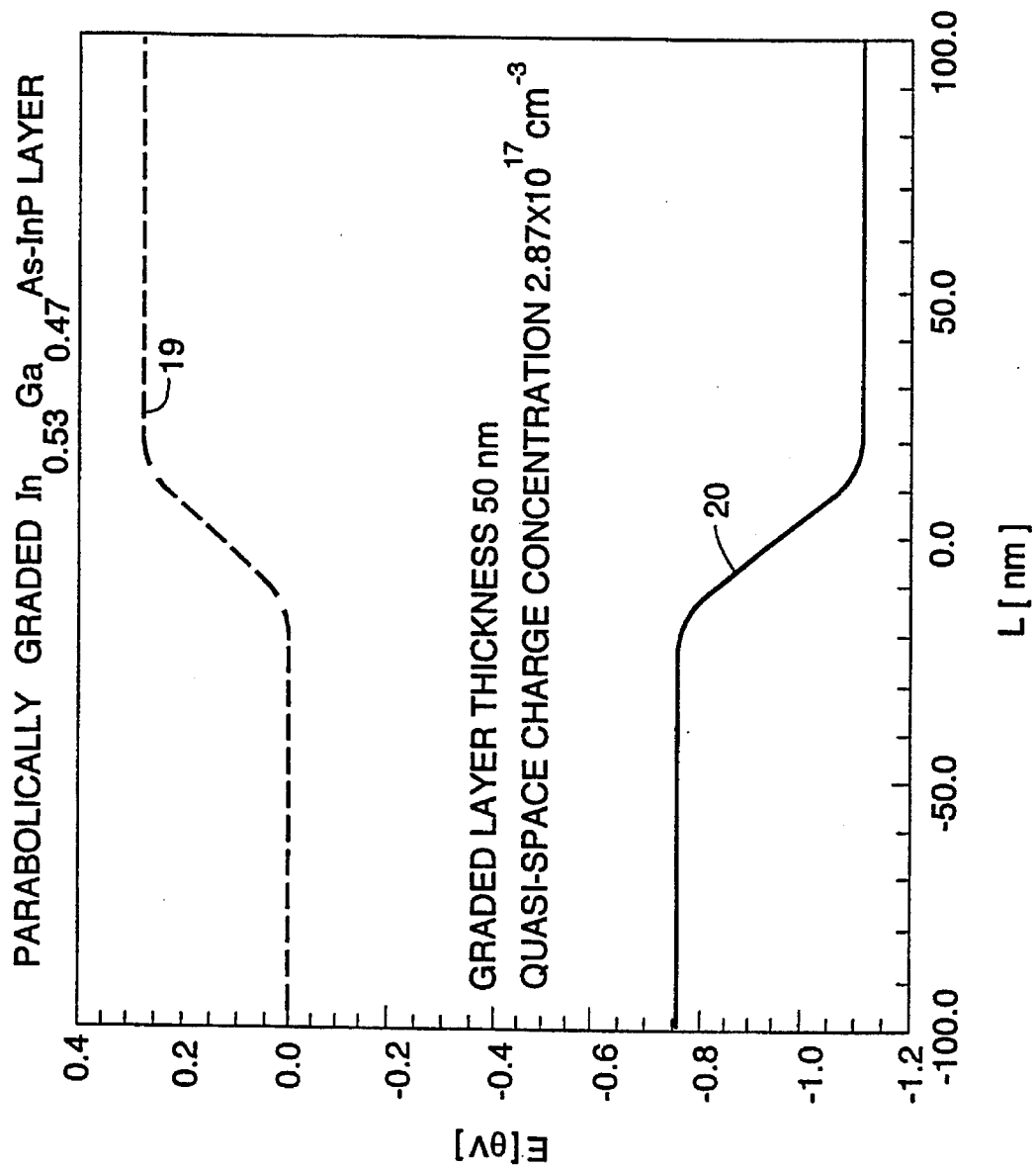
FIG. 2a, on coordinates of energy E (in eV) and distance L (in nm), is a plot of the bandgap variation as a function of distance in the parabolic grade of the invention, without doping.
Figure 2B:
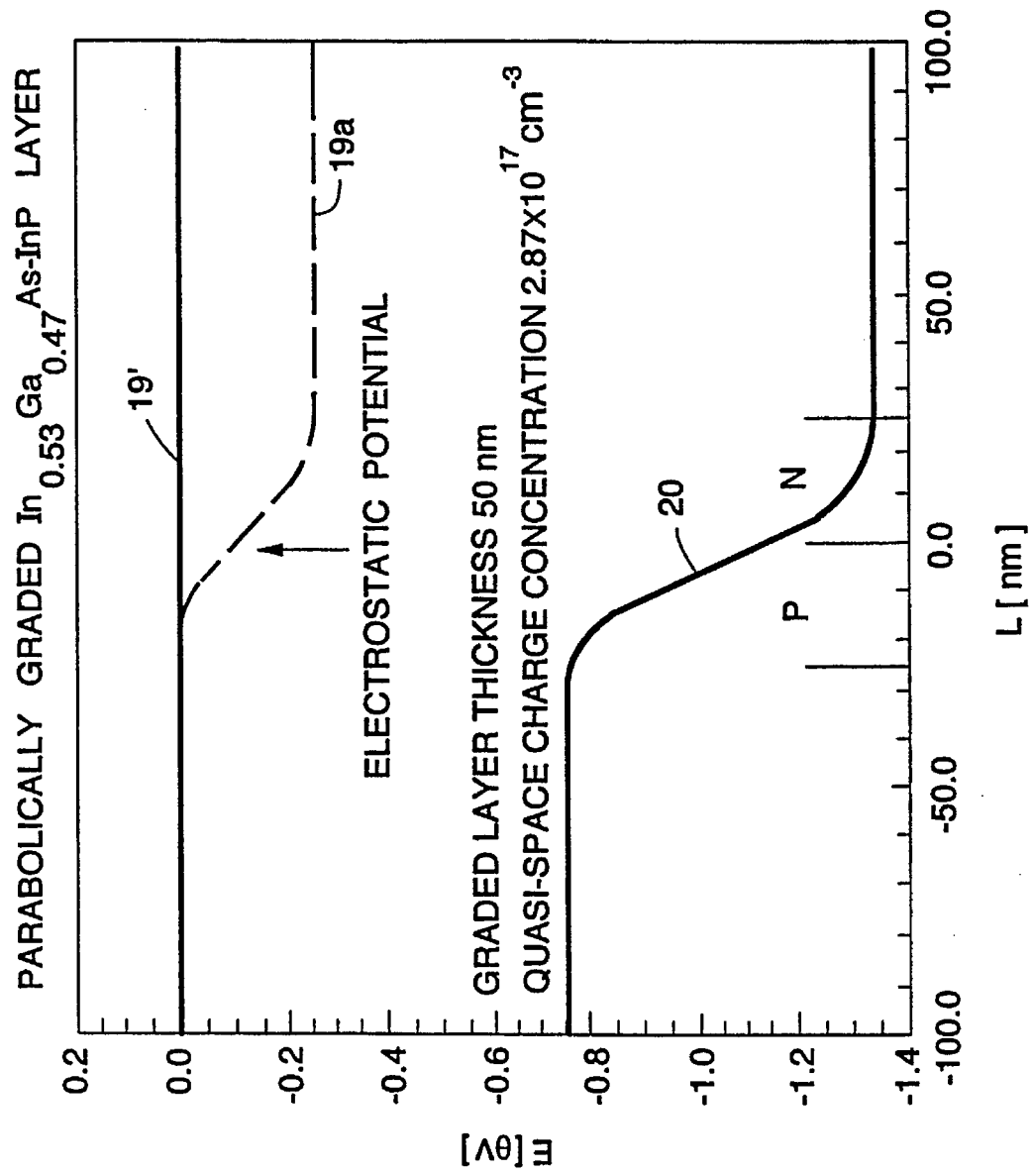
FIG. 2b, on coordinates of energy E (in eV) and distance L (in nm), is a plot showing the effect of combining the proper doping with the parabolic grade of the invention, which results in a barrier-free conduction band-edge.

The thickness of the graded layer 16 is typically set at about 500 to 1,000Å. As shown in FIG. 2a, the dashed curve 19 is the conduction band-edge in the absence of doping for a DHBT structure containing a parabolically graded $In_{0.53}Ga_{0.47}As$-InP base-collector, in which the graded layer thickness is 50 nm and the quasi-space charge concentration is $2.87 \times 10^{17}$ cm$^{-3}$. The solid curve 20, which is not of concern here, is the valence band-edge. FIG. 2b shows the effect of combining the proper doping with the parabolic grade in the device featured in FIG. 2a, which results in a barrier-free conduction band-edge, shown as solid curve 19' (dashed curve 19a is the electrostatic potential.

Figure 3A:
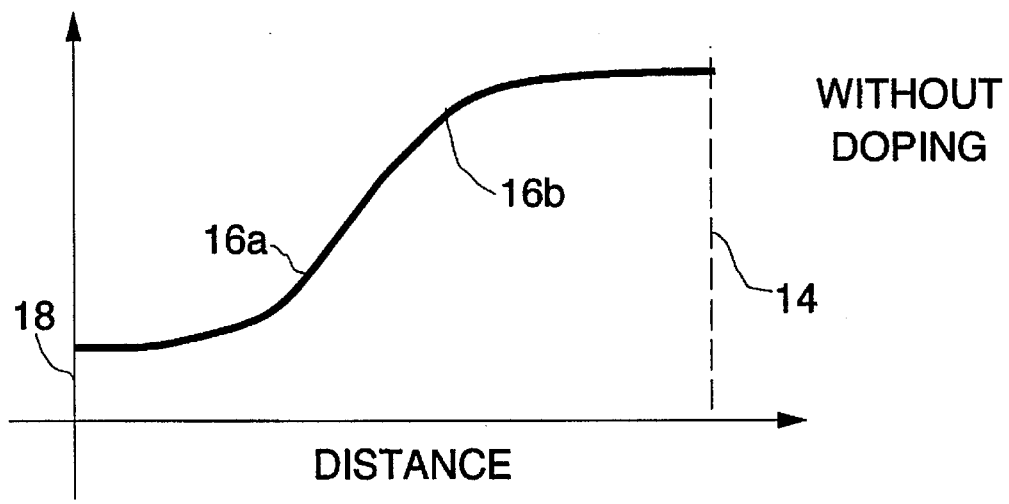
Figure 3B:
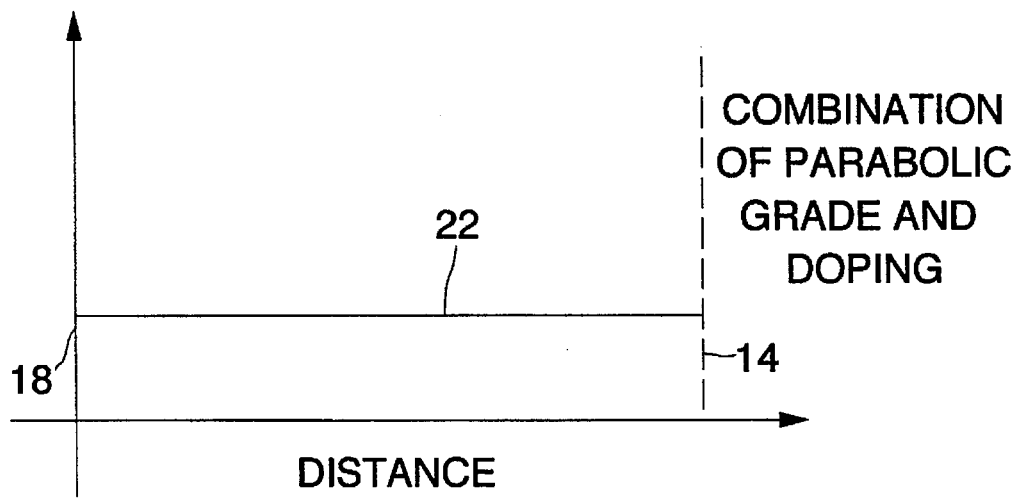
FIG. 3b, on coordinates of energy E (in eV) and distance L (in nm), is a schematic plot of FIG. 2b.

FIG. 3a, which is a schematic representation of FIG. 2a, illustrates how the graded region is divided into two parabolic segments 16a, 16b, one concave (16a) and one convex (16b). Uniform doping concentrations required on each segment are computed to completely flatten the conduction band 22 as shown in FIG. 3b, thus providing a parabolic grade with a correct doping profile. As used herein, a correct doping profile is one providing an essentially constant doping (that is, the electron carriers experience constant doping). One way to achieve such an effective constant doping in a graded layer is disclosed and claimed in the co-pending U.S. patent application Ser. No. 08/349,097.

Specifically, in a graded composition layer comprising a plurality of altercating layers of a first composition and a second composition, only one of the two compositions is doped with a dopant.

The constant doping required in each segment of the graded region is much lower than those used in a conventional spacer design and since the grade is completely depleted even at zero bias, then the constant dopings have no effect on the breakdown voltage. The alloy composition required to achieve the two parabolic segments is calculated based on the solid model. The growth of the whole DHBT structure, including the parabolic grade, is done by gas-source molecular beam epitaxy (GSMBE). To achieve the parabolic grade, a chirped superlattice was used to mimic the alloy composition. The constant dopings in the digital alloy are achieved by an innovative process that requires minimal GSMBE growth interruption, as disclosed and claimed in copending U.S. patent application Ser. No. 08/349,097. Alternate combinations of electrically-active elemental and alloy semiconductors in the parabolically grade will be apparent to those skilled in the art.

As indicated above, a chirped superlattice is used to mimic the parabolically varying alloy composition. Each period of the superlattice consists of one relatively low-bandgap layer and one relatively high-bandgap layer. The average composition in each period is determined by the relative thicknesses of these two layers. By varying the thickness ratio of these layers approximately parabolically with (i) the distance from the base for the concave parabola (Curve 16a in FIG. 3a) and (ii) the distance from the collector for the convex parabola (Curve 16b in FIG. 3a), the intended parabolic grade is achieved. The exact values have to be computed numerically; however, this is readily within the capability of a person skilled in this art.

Figure 4:
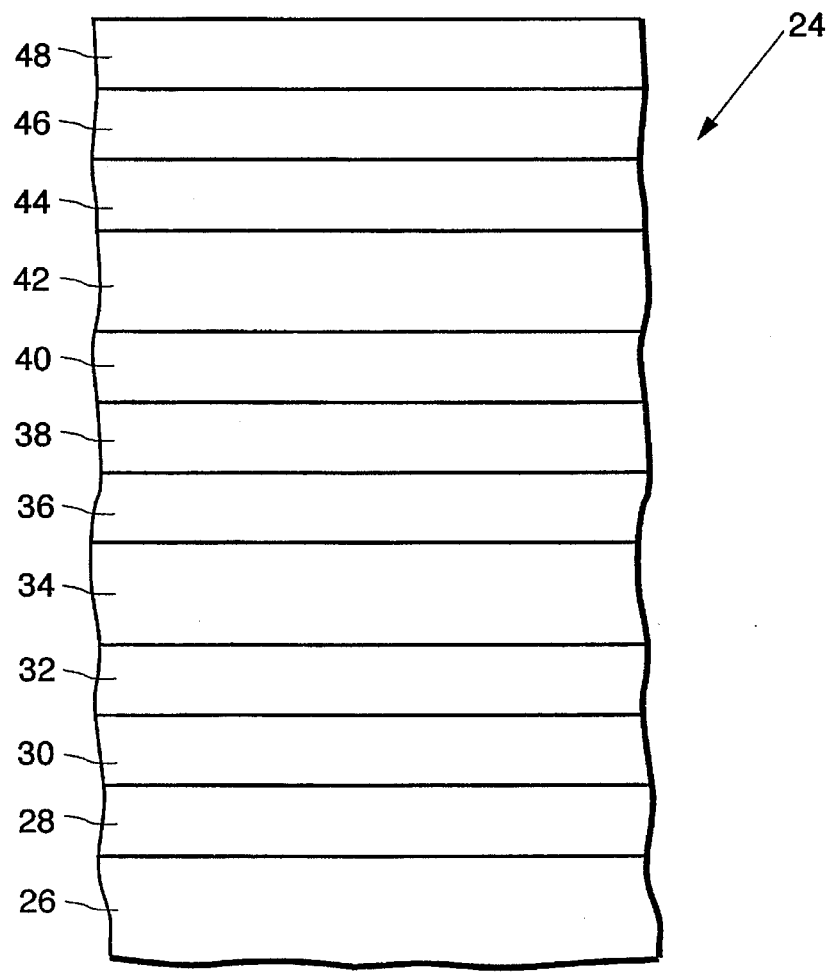
FIG. 4 is a cross-sectional view of the device obtained in accordance with the teachings of the present invention, showing a full DHBT with a parabolic grade.
Figure 5:
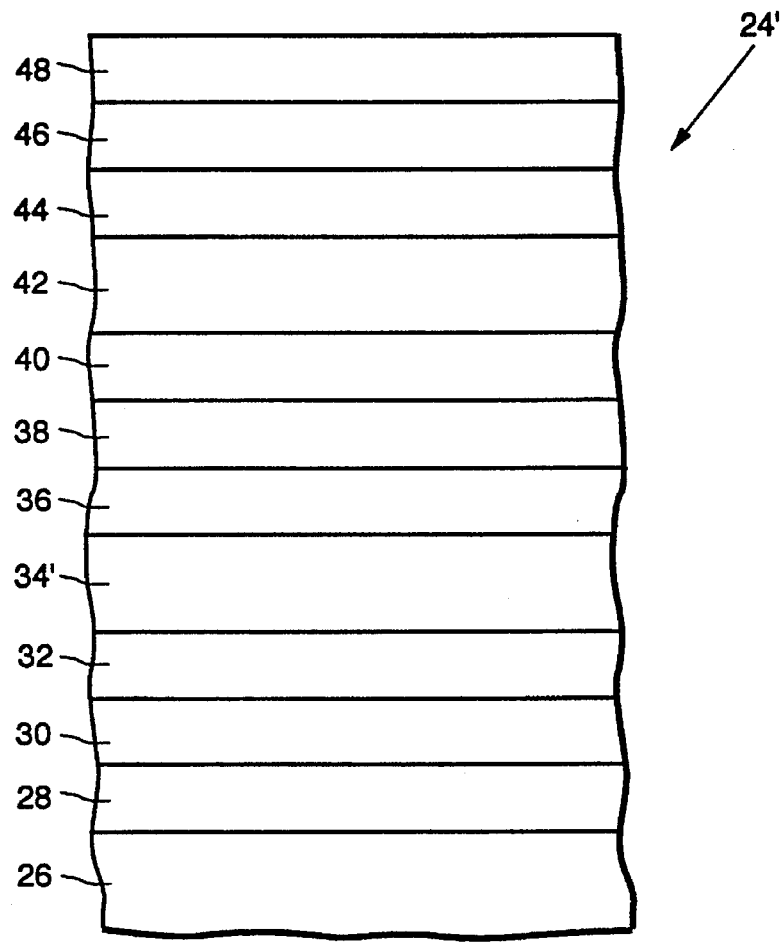
FIG. 5 is a view similar to that of FIG. 4, but showing a conventional linear grade.

A conventional linearly-graded DHBT is also prepared for comparison. FIG. 4 depicts a full DHBT with a parabolic grade and FIG. 5 depicts a control DHBT with a conventional linear grade. Specifically, FIG. 4 provides a cross-sectional view of the device 24. A semi-insulating substrate 26 comprises InP. A collector contact layer 28 is formed on the substrate and comprises n-doped GaInAs, 700 nm thick and doped to a concentration of $1 \times 10^{19}$ cm$^{-3}$. A subcollector layer 30 is formed on the collector contact layer 28 and comprises n-doped InP, 100 nm thick and doped to a concentration of $1 \times 10^{19}$ cm$^{-3}$. A collector layer 32 is formed on the subcollector layer 30 and also comprises n-doped InP, 750 nm thick and doped to a concentration of $2.4 \times 10^{16}$ cm$^{-3}$. A base-collector grading layer 34 is formed on the collector layer 32 and employs the graded conduction band-gap of the present invention, starting with n-doped InP (concentration at $1 \times 10^{17}$ cm$^{-3}$), 50 nm, and concluding with p-doped GaInAs (concentration at $1 \times 10^{17}$ cm$^{-3}$), 50 nm. Specifically, the n-doped part of the grade consists of a chirped superlattice having 17 periods, each period being about 3 nm thick, which results in a total thickness of about 50 nm for the n-doped region. Silicon is used as the dopant for this region. The p-doped region is similarly constructed, but with beryllium used as the dopant. Details of the doping technique are described in the companion U.S. patent application Ser. No. 08/349,097.

Next, a base spacer layer 36 is formed on the graded base-collector layer 34 and comprises p-doped GaInAs, 10 nm thick and doped to a concentration of $1 \times 10^{17}$ cm$^{-3}$. A base layer 38 is formed on the base spacer layer 36, also comprising p-doped GaInAs, 50 nm thick and doped to a concentration of $2 \times 10^{19}$ cm$^{-3}$. Mother base spacer layer 40 is formed on the base layer 38, also comprising p-doped GaInAs, 10 nm thick and doped to a concentration of $1\times10^{18}$ cm$^{-3}$. An emitter-base superlattice grading layer 42 is formed on top of the base spacer layer 40, starting with p-doped GaInAs (concentration at $1\times10^{-}$cm$^{-3}$), 9.9 nm, and concluding with n-doped AlInAs (concentration at $8\times10^{17}$ cm$^{-3}$), 19.8 nm. An emitter layer 44 is formed on the emitter-base grading layer 42, comprising n-doped AlInAs, 120 nm thick and doped to a concentration of $8\times10^{17}$ cm$^{-3}$. An emitter contact layer 46 is formed on the emitter layer 44, also comprising n-doped AlInAs, 70 nm thick and doped to a concentration of $1\times10^{19}$ cm$^{-3}$. A cap layer 48 is formed on the emitter contact layer 46 and comprises n-doped GaInAs, 100 nm thick and doped to a concentration of $1\times10^{19}$ cm$^{-3}$.

The thicknesses and doping concentrations described above are exemplary are to be considered as exemplary only.

In FIG. 5, the elements are the same as those shown in FIG. 4, except that the base-collector grading layer 34' is linearly graded, while the corresponding layer 34 in FIG. 4 is parabolically graded.

Figure 6:
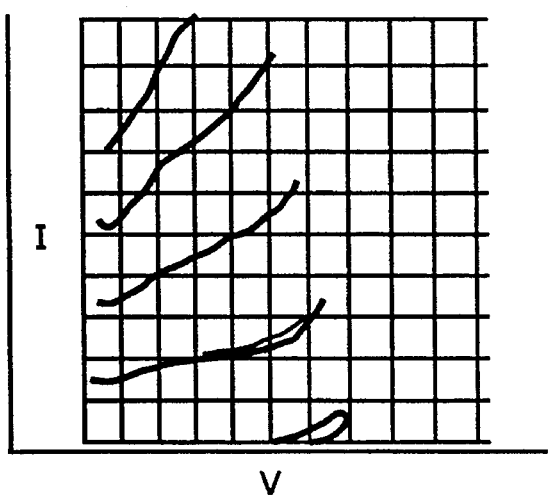
FIG. 6, on coordinates of current (I, in microAmps) and voltage (V, in volts), are plots of output characteristics for the device depicted in FIG. 5; in which each vertical division is 500 µA and each horizontal division is 2 V, with the base current in steps of 20 µA.
Figure 7:
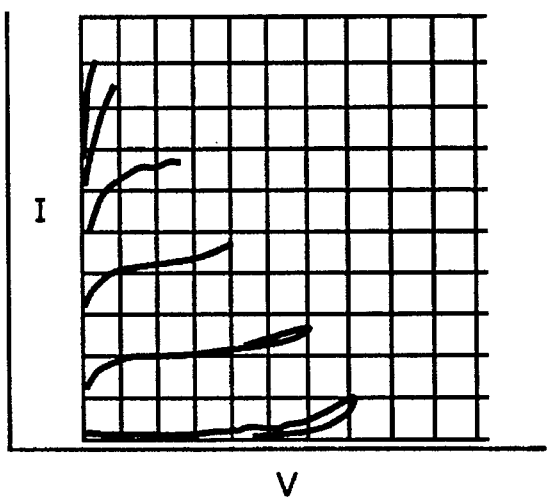
FIG. 7, on coordinates of current (I, in microAmps) and voltage (V, in volts), are plots of output characteristics for the device depicted in FIG. 4, with divisions as in FIG. 6.

The output characteristics for the linearly-graded DHBT (structure of FIG. 5) and parabolically-graded DHBT (structure of FIG. 4) are shown in FIG. 6 and FIG. 7, respectively. Compared to the linearly-graded DHBT, the parabolically-graded DHBT shows much smaller kinks in the IV curves. Secondly, the elimination of the electron barrier results in a sharper turn-on characteristic.

The process of the present invention is expected to have a significant impact on a number of microwave devices, including, but not limited to, (1) analog-to-digital (A/D) devices; (2) radar system very-high-frequency (VHF) switches operating above 200 MHz at >200 V; and (3) radar system wideband (7 to 11 GHz), high power (>8 W), high gain (>9 dB), high efficiency (>50%) power amplifiers with heterojunction bipolar transistor (HBT) of breakdown voltage, open-circuited collector-base (BVcbo) >25 V maximum frequency of oscillation (Fmax) >90 GHz power cell 2 W@50% power-added efficiency (PAE).

Thus, there has been disclosed a double heterojunction bipolar transistor having a base-collector region that is graded parabolically in band-edge and a method for the fabrication of same. It will be readily appreciated by those skilled in this art that changes or modifications of an obvious nature may be made, and all such changes and modifications are considered to fall within the scope of the invention as defined by the appended claims.

What is claimed is:

1. A double heterojunction bipolar transistor including collector, base, and emitter regions and formed on a substrate, said base and collector separated by a base-collector layer, said collector region comprising a first semiconductor composition having a first bandgap and said base region comprising a second semiconductor composition having a second bandgap, said base-collector layer comprising a plurality of alternating layers of said first and second compositions configured so as to provide a parabolic grading in bandgap from said base region to said collector region.

2. The transistor of claim 1 wherein said substrate comprises InP, said collector region comprises n-doped InP, said base region comprises p-doped GaInAs, and said emitter region comprises n-doped MInAs.

3. The transistor of claim 2 wherein said base-collector layer comprises a plurality of alternating layers of InP and GaInAs forming a graded region, starting with n-doped InP and concluding with p-doped GaInAs and parabolic in variation of conduction band-edge.

4. The transistor of claim 3 wherein said InP is doped with silicon to form said n-InP.

5. The transistor of claim 3 wherein said GaInAs is doped with beryllium to form said p-GaInAs.

6. The transistor of claim 1 wherein said one of said compositions in said base-collector layer is doped with a dopant.

7. The transistor of claim 1 wherein said base-collector layer comprises a chirped superlattice having a plurality of periods, each period comprising one of said layers of said first composition and one of said layers of said second composition, said layer of said first composition and said layer of said second composition each having a thickness, each period characterized by a ratio of said thickness of said layer of said first composition and said layer of said second composition, said ratio of said thickness for said plurality of periods varying approximately parabolically with one of (i) the distance from said base region for a concave parabola and (ii) the distance from said collector region for a convex parabola, such that said chirped superlattice mimics a parabolically varying alloy composition.

8. The transistor of claim 1 wherein said base-collector layer comprises an n-doped region comprising a plurality of alternating layers of said first composition and second composition, wherein one of said compositions is doped with a dopant, and a p-doped region comprising a plurality of alternating layers of said first composition and said second composition, wherein one of said compositions is doped with a dopant.

9. The transistor of claim 8 wherein said base-collector layer comprises an n-doped region comprising a plurality of alternating layers of InP and GaInAs, wherein one of said compositions is doped with silicon, and a p-doped region comprising a plurality of alternating layers of InP and GaInAs, wherein one of said compositions is doped with beryllium.

10. A method of providing an essentially featureless bandgap region in a semiconductor device having a graded compositional alloy, said region sandwiched between two separate regions, one having a first composition and the other having a second composition, said graded compositional alloy comprising a plurality of alternating layers of said first composition and said second composition, wherein said region is parabolically graded in said bandgap.

11. The method of claim 10 wherein said first composition and said second composition each consist essentially of a III–V material.

12. The method of claim 11 wherein said first composition consists essentially of InP and said second composition consists essentially of GaInAs.

13. The method of claim 10 wherein said first composition and said second composition have different conductivity types.

14. The method of claim 10 wherein one of said compositions in said graded compositional alloy is doped with a dopant.

15. The method of claim 10 wherein said graded compositional alloy comprises an n-doped region comprising a plurality of alternating layers of said first composition and said second composition, wherein one of said compositions is doped with a dopant, and a p-doped region comprising a plurality of alternating layers of said first composition and said second composition, wherein one of said compositions is doped with a dopant.

16. The method of claim 12 wherein said graded compositional alloy comprises an n-doped region comprising a plurality of alternating layers of said InP and said GaInAs, wherein one of said compositions is doped with silicon, and a p-doped region comprising a plurality of alternating layers of said InP and said GaInAs, wherein one of said compositions is doped with beryllium.

17. The method of claim 16 wherein said InP is doped with silicon to form said n-InP.

18. The method of claim 16 wherein said GaInAs is doped with beryllium to form said p-GaInAs.

19. The method of claim 10 wherein said graded compositional alloy comprises a chirped superlattice having a plurality of periods, each period comprising one of said layers of said first composition and one of said layers of said second composition, said layer of said first composition and said layer of said second composition each having a thickness, each period characterized by a ratio of said thickness of said layer of said first composition and said layer of said second composition, said ratio of said thickness for said plurality of periods varying approximately parabolically with one of (i) the distance from said region having said first composition for a concave parabola and (ii) the distance from said region having said second composition for a convex parabola such that said chirped superlattice mimics a parabolically varying alloy composition.

* * * * *